(12) United States Patent
Nei

(10) Patent No.: US 8,643,032 B2
(45) Date of Patent: Feb. 4, 2014

(54) LIGHT EMITTING DIODE PACKAGE ARRAY AND METHOD FOR FABRICATING LIGHT EMITTING DIODE PACKAGE

(75) Inventor: Masami Nei, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/597,789

(22) Filed: Aug. 29, 2012

(65) Prior Publication Data

US 2013/0049033 A1    Feb. 28, 2013

(30) Foreign Application Priority Data

Aug. 29, 2011    (KR) .................. 10-2011-0086492

(51) Int. Cl.
*H01L 33/48* (2010.01)
*H01L 33/50* (2010.01)

(52) U.S. Cl.
USPC .................. 257/88; 257/E33.056; 438/27

(58) Field of Classification Search
USPC .................. 257/88, E33.056; 438/27
See application file for complete search history.

(56) References Cited

U.S. PATENT DOCUMENTS

| 5,998,925 A | 12/1999 | Shimizu et al. |
| 2007/0009613 A1 | 1/2007 | Yang |
| 2008/0164482 A1* | 7/2008 | Obara et al. ............ 257/88 |

FOREIGN PATENT DOCUMENTS

| JP | 2010-153648 | 7/2010 |
| KR | 102010009994 A | 9/2010 |
| KR | 102011002524 A | 3/2011 |

* cited by examiner

*Primary Examiner* — Whitney T Moore
(74) *Attorney, Agent, or Firm* — Muir Patent Consulting, PLLC

(57) ABSTRACT

A light emitting diode (LED) package includes: an array substrate; a plurality of LEDs mounted on the array substrate and arranged in rows and columns; a plurality of wavelength conversion units disposed in a light path of light emitted from each of the plurality of LEDs to convert the wavelength thereof; a plurality of first inspection terminals formed on the array substrate and electrically connected to LEDs in the same rows, among the plurality of LEDs; and a plurality of second inspection terminals formed on the array substrate and electrically connected to LEDs in the same columns, among the plurality of LEDs.

21 Claims, 5 Drawing Sheets

LIGHT EMITTING DIODE PACKAGE ARRAY AND METHOD FOR FABRICATING LIGHT EMITTING DIODE PACKAGE

CROSS-REFERENCE TO RELATED APPLICATIONS

This application claims the priority of Korean Patent Application No. 10-2011-0086492 filed on Aug. 29, 2011, in the Korean Intellectual Property Office, the disclosure of which is incorporated herein by reference.

BACKGROUND

The present disclosure relates to a light emitting diode package array and a method for fabricating a light emitting diode package.

A general light emitting diode (LED) realizes white light emissions by synthesizing an emission wavelength and a light converting wavelength of a light conversion phosphor. For example, white light emissions can be obtained by coating a red phosphor. In this case, when the quantity of spread (or applied) phosphors is small, the rate of blue spectrum light is increased to make white light close to blue, and when the quantity of spread phosphors is large, it makes white light close to red. Thus, in order to fabricate an LED having a desired color temperature, the quantity of spread phosphors should be precisely adjusted in a fabrication process.

SUMMARY

An aspect of the present disclosure provides a light emitting diode (LED) package array in which photoluminescence of a plurality of LEDs can be effectively managed, and a method of fabricating an LED package.

Certain embodiments provide a light emitting diode package array in which LED luminescence (or light emission) can be inspected and additional wavelength conversion material can be applied thereto during a fabrication process, thus enhancing a production yield, and a method for fabricating a light emitting diode package.

According to one embodiment, there is provided a light emitting diode (LED) package including: an array substrate; a plurality of LEDs mounted on the array substrate and arranged in rows and columns; a plurality of wavelength conversion units disposed in a light path of light emitted from each of the plurality of LEDs to convert the wavelength thereof; a plurality of first inspection terminals formed on the array substrate and electrically connected to LEDs in the same rows, among the plurality of LEDs; and a plurality of second inspection terminals formed on the array substrate and electrically connected to LEDs in the same columns, among the plurality of LEDs.

The LED package may further include: a plurality of first electrodes and a plurality of second electrodes electrically connected to the plurality of LEDs and exposed from the array substrate.

The LED package may further include: a plurality of third electrodes and a plurality of fourth electrodes disposed to oppose the plurality of first electrodes and the plurality of second electrodes on the array substrate; a first via electrically connecting the plurality of first electrodes and the plurality of third electrodes through the array substrate; and a second via electrically connecting the plurality of second electrodes and the plurality of fourth electrodes through the array substrate.

The LED package may further include: a plurality of first conductive layers disposed to be in contact with a lower portion of the plurality of LEDs and electrically connected to the first via.

The LED package may further include: a plurality of wires electrically connecting the plurality of LEDs and the plurality of second electrodes.

The LED package may further include: a plurality of heat dissipation vias in contact with a lower portion of the plurality of first conductive layers; and a plurality of second conductive layers disposed to be in contact with a lower portion of the plurality of heat dissipation vias and electrically connected to the first via.

The LED package may further include: a plurality of heat sinks disposed to oppose the plurality of wavelength conversion units and externally releasing heat generated from the plurality of LEDs.

The array substrate may be a ceramic substrate.

The wavelength conversion units may be formed by dispersing a wavelength conversion material in a resin.

The plurality of first inspection terminals and the plurality of second inspection terminals may be formed on the edges of the array substrate.

Two first inspection terminals, among the plurality of first inspection terminals, may be formed per one row.

Two second inspection terminals, among the plurality of second inspection terminals, may be formed per one column.

According to another embodiment, there is provided a method for fabricating a light emitting diode (LED) package, including: preparing an array substrate and mounting a plurality of LEDs thereon, such that the LEDs are arranged in rows and columns; forming a plurality of wavelength conversion units in the light path of light emitted from each of the plurality of LEDs to convert the wavelength thereof; forming a plurality of first inspection terminals on the array substrate and electrically connected to LEDs in the same rows, among the plurality of LEDs; forming a plurality of second inspection terminals on the array substrate and electrically connected to LEDs in the same columns, among the plurality of LEDs; and applying an electrical signal to the first and second inspection terminals to inspect light emission of the plurality of LEDs.

The method may further include: supplementarily applying the wavelength conversion material to an LED whose wavelength conversion material is determined to be insufficient according to the results of an inspection of the light emission of the plurality of LEDs.

The method may further include: molding a transparent resin on the wavelength conversion unit.

The method may further include: dicing the array substrate into LED units.

The array substrate may be a ceramic substrate.

The wavelength conversion units may be formed by dispersing a wavelength conversion material in a resin.

The plurality of first inspection terminals and the plurality of second inspection terminals may be formed on the edges of the array substrate.

Two first inspection terminals, among the plurality of first inspection terminals, may be formed per one row.

Two second inspection terminals, among the plurality of second inspection terminals, may be formed per one column.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
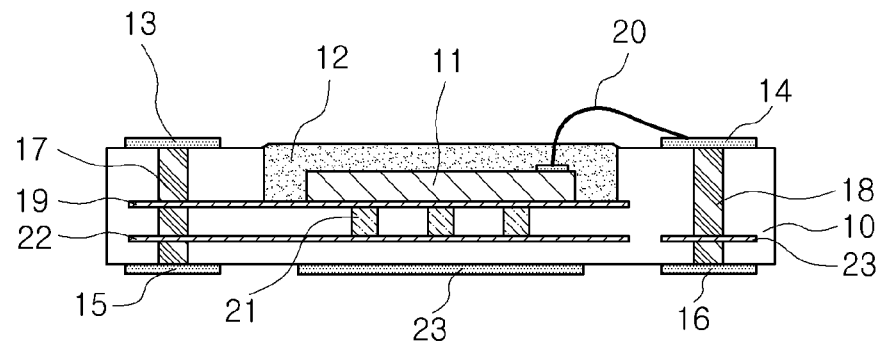
FIG. 1 is a cross-sectional view of a light emitting diode (LED) package according to an exemplary embodiment.

Various embodiments will now be described in detail with reference to the accompanying drawings. The invention may, however, be embodied in many different forms and should not be construed as being limited to the embodiments set forth herein.

In the drawings, the shapes and dimensions of elements may be exaggerated for clarity, and the same reference numerals will be used throughout to designate the same or like components.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
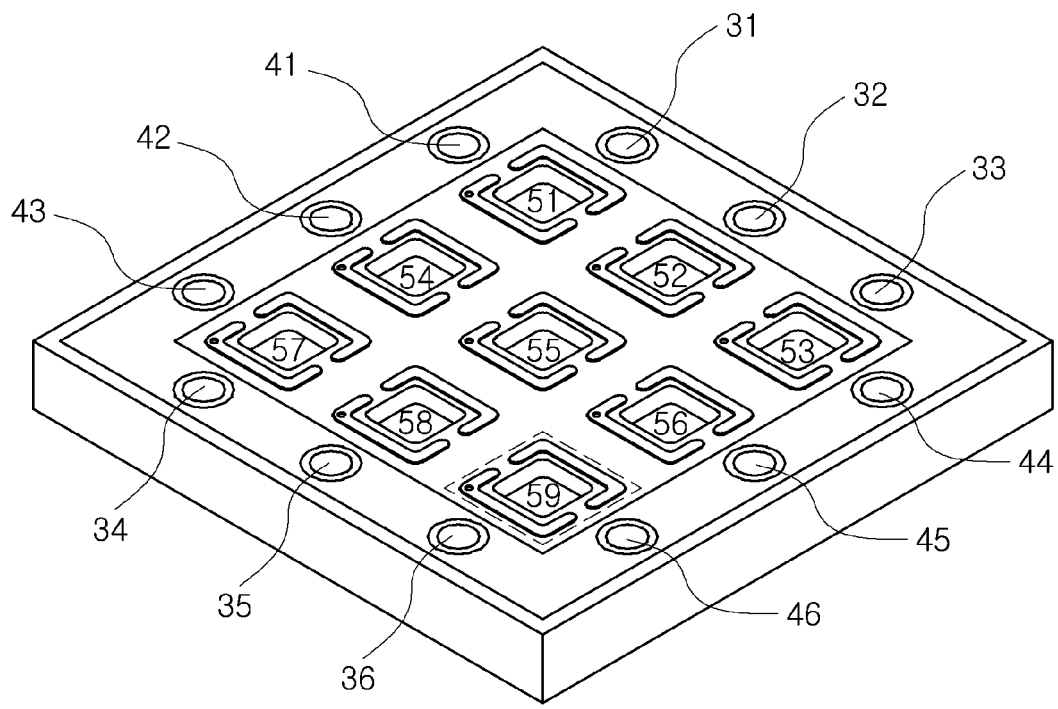
FIG. 2 is a perspective view of an LED package array according to an exemplary embodiment.

FIG. 1 is a cross-sectional view of a light emitting diode (LED) package according to an exemplary embodiment, and FIG. 2 is a perspective view of an LED package array according to an exemplary embodiment.

With reference to FIGS. 1 and 2, the LED package includes an array substrate 10, an LED 11, a wavelength conversion unit 12, first inspection terminals 31, 32, 33, 34, 35, and 36, and second inspection terminals 41, 42, 43, 44, 45, and 46.

Various substrates may be used as the array substrate 10, and in one embodiment, a ceramic substrate having high heat dissipation efficiency and durability is used. A plurality of LEDs 11 are mounted in an arrangement of rows and columns on the array substrate 10. A plurality of wavelength conversion units 12 are disposed in a path of light emitted from the respective LEDs 11 to convert the wavelength of light.

The first inspection terminals 31, 32, 33, 34, 35, and 36 are electrically connected to LEDs in the same rows, and the second inspection terminals 41, 42, 43, 44, 45, and 46 are electrically connected to LEDs in the same columns.

Each of the LEDs 11 in the respective rows and columns may be connected with two inspection terminals, and in one embodiment, the two inspection terminals disposed in the same rows or columns serve to execute the same function. In the embodiment depicted in FIGS. 1 and 2, each of the first inspection terminals 31, 32, and 33 and each of the first inspection terminals 34, 35, and 36 may correspond to each row, and each of the second inspection terminals 41, 42, and 43 and each of the second inspection terminals 44, 45, and 46 may correspond to each column. In this case, two among first inspection terminals may correspond to each row, and two among the second inspection terminals may correspond to each column, so that if any one of the two is defective, the other may be used.

A plurality of first, second, third, and fourth electrodes 13, 14, 15, and 16 are formed to be exposed from the array substrate 10. The first to fourth electrodes 13, 14, 15, and 16 are used to operate respective LEDs upon receiving an electrical signal from the outside. The electrodes may be disposed at a surface of the array substrate 10. In one embodiment, the first and third electrodes 13 and 15, and the second and fourth electrodes 14 and 16 are connected with the same inner electrode of the LED, respectively, and serve as the same electrodes. Thus, in certain embodiments, only any one of the first and third electrodes 13 and 15 may be provided, and only any one of the second and fourth electrodes 14 and 16 may be provided. However, in one embodiment, the four electrodes 13, 14, 15, and 16 are provided in a vertical direction of the array substrate 10, so that if any one of the electrodes is defective, the other one can be substitutively used.

A first via 17 may be disposed in a penetrative manner between the first and third electrodes 13 and 15, and a second via 18 may be disposed between the second and fourth electrodes 14 and 16 in a penetrative manner. The first and second vias 17 and 18 electrically connect the electrodes. In one embodiment, the electrodes and vias described herein may be formed, for example, of a conductive material, such as one or more metals.

A first conductive layer 19 is disposed to be in contact with the LED 11 at a lower portion of the LED 11, and the first conductive layer is electrically connected to the first via 17.

The second electrode 14 is electrically connected to the LED 11 through a wire 20. However, instead of the wire 20 having such a form as illustrated in FIG. 2, a different type of wiring structure may also be used.

Heat dissipation vias 21 are in contact with a lower portion of the first conductive layer 19 to dissipate heat generated from the LED 11. The heat dissipation vias 21 may be formed, for example, of a heat-conductive material. In one embodiment, the material includes a metal. The first and second vias 17 and 18 may be formed of the same material as the heat dissipation vias 21. However, in some embodiments, the first and second vias 17 and 18 are formed of materials having a different composition than the heat dissipation vias 21.

A second conductive layer 22 is disposed to be in contact with the heat dissipation vias 21. Like the first conductive layer 19, the second conductive layer 22 is in contact with the first via 17 to dissipate heat generated from the LED 11. The first and second conductive layers 19 and 22 may be formed, for example, of a conductive material, such as one or more metals.

A heat sink 23, formed of a heat-conductive material, may be further provided on the opposite side of the wavelength conversion unit 12 to effectively release (or dissipate) heat generated by the LED 11.

Figure 3:
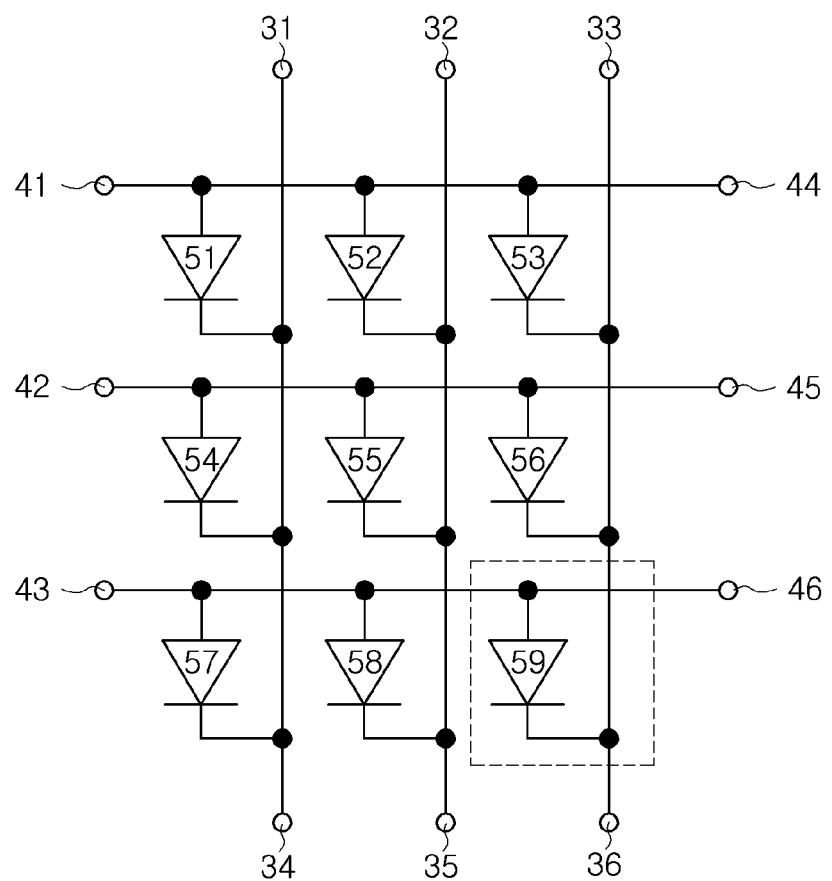
FIG. 3 is an exemplary equivalent circuit diagram of the LED package array illustrated in FIG. 2.

FIG. 3 is an exemplary equivalent circuit diagram of the LED package array illustrated in FIG. 2.

With reference to FIGS. 2 and 3, the desired LEDs 11 may be tested by applying an electrical signal to the inspection terminals corresponding to rows and columns of the respective LEDs, i.e., inspection terminals electrically connected to the respective LEDs 11, among the inspection terminals 31, 32, 33, 34, 35, 36, 41, 42, 43, 44, 45, and 46 positioned on an outer circumference of the mounting substrate. For example, in order to inspect illumination of an LED 59 among the LEDs illustrated in FIGS. 2 and 3, an electrical signal may be applied to any one of the inspection terminals 33 and 36 and any one of the inspection terminals 43 and 46.

Figure 4:
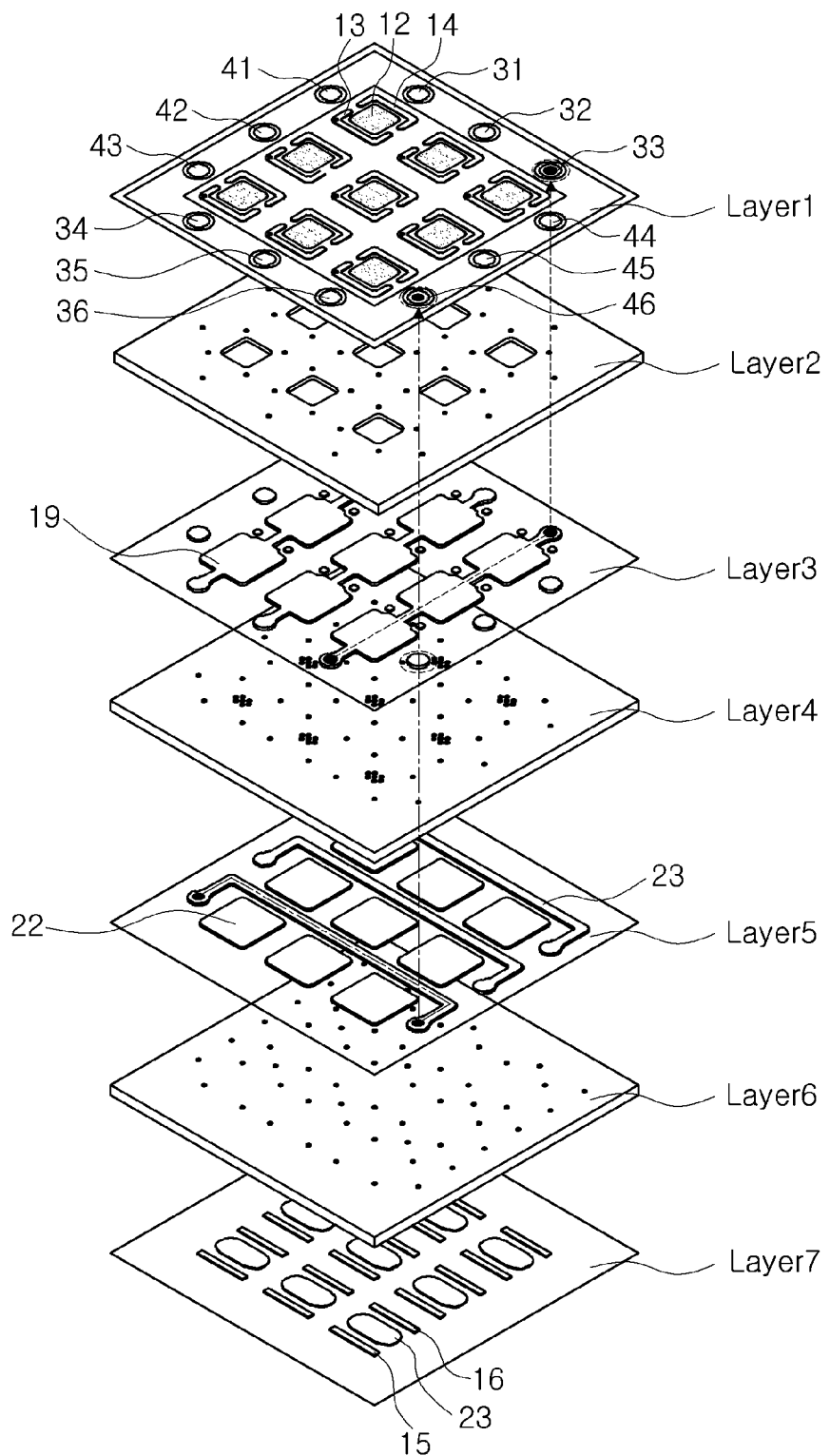
FIG. 4 is an exemplary exploded perspective view of the LED package array split by layer.

FIG. 4 is an exemplary exploded perspective view of the LED package array split by layer. With reference to Layer 3, the LEDs in the same row may be electrically connected to the first inspection terminals by mutually connecting the first conductive layers 19 of the LEDs of the respective rows by an electrode pattern. Also, with reference to Layer 5, the LEDs in the same column may be electrically connected to the second inspection terminals by mutually connecting the second vias 18 of the LEDs of the respective rows by an electrode pattern.

In this manner, in the LED package array in which the inspection terminals are provided on the array substrate 10 and the LEDs at the respective rows and columns and the inspection terminals are electrically connected, LEDs can be easily inspected by applying an electrical signal to the inspection terminals. Also, in the process of fabricating the LED package, the wavelength conversion unit 12 can be inspected, and an additional wavelength conversion material can be coated (or applied) as necessary, improving the production yield of the LED package.

A method for fabricating an LED package according to an exemplary embodiment will be described with reference to FIGS. 5 through 9. FIGS. 5 through 9 are schematic views showing an exemplary method for fabricating an LED package according to one embodiment.

Figure 5:
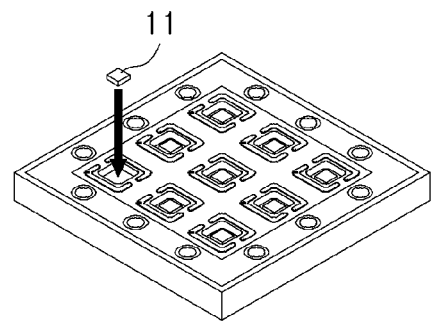
FIGS. 5 through 9 are schematic views showing an exemplary method for fabricating an LED package according to one embodiment.

First, the array substrate 10 on which a plurality of LEDs 11 are to be mounted is prepared, and the plurality of LEDs 11 are mounted to be arranged in rows and columns on the array substrate 10 as shown in FIG. 5.

Figure 6:
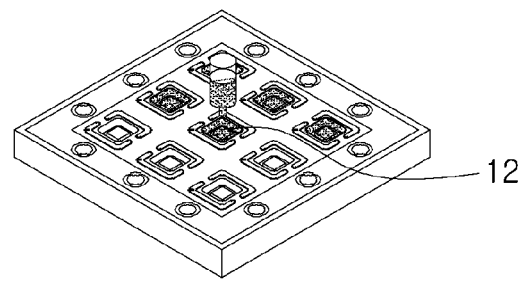

After the LEDs 11 are mounted, as shown in FIG. 6, a plurality of wavelength conversion units 12 for converting the wavelength of light are formed in the light paths of light emitted from the respective LEDs. The wavelength conversion units 12 may be formed, for example, by coating a wavelength conversion material at an upper portion of each of the LEDs 11.

The first inspection terminals 31, 32, 33, 34, 35, and 36 are formed to be electrically connected to the LEDs in the same rows and the second inspection terminals 41, 42, 43, 44, 45, and 46 are formed to be electrically connected to the LEDs in the same columns.

The first and second inspection terminals may be previously formed before the LEDs 11 are mounted, or may be formed after the LEDs 11 are mounted.

As for the first and second inspection terminals, on one embodiment, only one inspection terminal is formed at the edge of the array substrate, such that it corresponds to one row or column formed by the plurality of LEDs. However, in another embodiment, two inspection terminals are formed so that when one inspection terminal is defective, the other one may be used.

Figure 7:
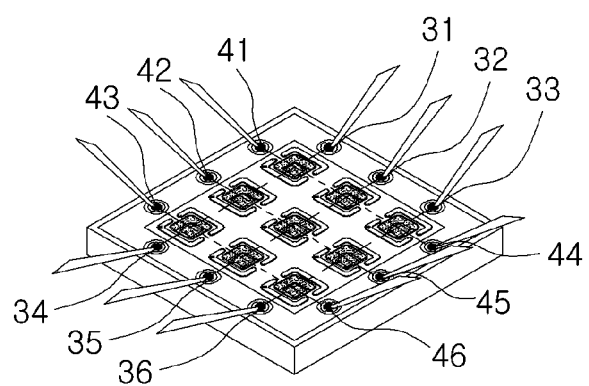

In a state in which the LEDs 11 are mounted on the substrate 10 and the wavelength conversion units 12 and the first and second inspection terminals 31, 32, 33, 34, 35, 36, 41, 42, 43, 44, 45, and 46 formed, as shown in FIG. 7, an electrical signal is applied to the first and second inspection terminals to inspect light emission of the LEDs 11. According to the results of an inspection of light emissions, when it is determined that a wavelength conversion material is insufficient, the wavelength conversion material may be supplementarily applied.

Figure 8:
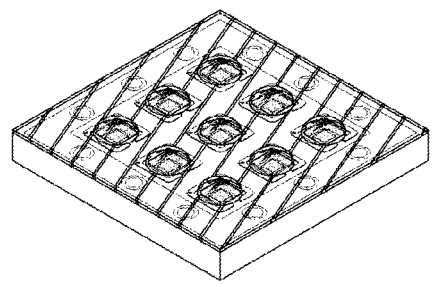

When the inspection of the LEDs 11 is completed, as shown in FIG. 8, a transparent resin is molded on the wavelength conversion units 12 in order to protect the LEDs 11 and the wavelength conversion units 12. Molding of a transparent resin may be omitted when unnecessary.

Figure 9:
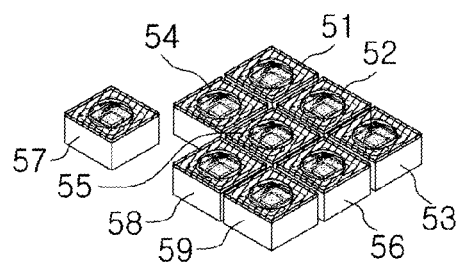

Finally, as shown in FIG. 9, the array substrate 10 is diced into LED units, thus completing a final LED package.

Rather than dicing the array substrate 10, a certain driver may be installed in the inspection terminals 31, 32, 33, 34, 35, 36, 41, 42, 43, 44, 45, and 46 positioned on the edges of the array substrate 10 to form and use a single cluster type LED package.

According to the method for fabricating an LED package as described above, light emission of the plurality of LEDs 11 can be easily inspected by applying electricity to the inspection terminals of the array substrate 10, and before the LED package is completed, the LEDs 11 may be inspected and if the wavelength conversion material is determined to be insufficient, the wavelength conversion material can be additionally applied, thus enhancing a production yield of the LEDs 11.

As set forth above, according to the disclosed embodiments, light emission of a plurality of LEDs can be easily inspected. Also, in the process of fabricating an LED package, a wavelength conversion material can be additionally applied after the LEDs are inspected, the production yield of the LEDs can be enhanced.

While the present disclosure has been shown and described in connection with the embodiments, it will be apparent to those skilled in the art that modifications and variations can be made without departing from the spirit and scope of the invention as defined by the appended claims.

What is claimed is:

1. A light emitting diode (LED) package comprising:
an array substrate;
a plurality of LEDs mounted on the array substrate and arranged in rows and columns;
a plurality of wavelength conversion units disposed in a light path of light emitted from each of the plurality of LEDs to convert the wavelength thereof;
a plurality of first inspection terminals formed on the array substrate and electrically connected to LEDs in the same rows, among the plurality of LEDs; and
a plurality of second inspection terminals formed on the array substrate and electrically connected to LEDs in the same columns, among the plurality of LEDs.

2. The LED package array of claim 1, further comprising a plurality of first electrodes and a plurality of second electrodes electrically connected to the plurality of LEDs and exposed from the array substrate.

3. The LED package array of claim 2, further comprising:
a plurality of third electrodes and a plurality of fourth electrodes disposed to oppose the plurality of first electrodes and the plurality of second electrodes on the array substrate;
a first via electrically connecting the plurality of first electrodes and the plurality of third electrodes through the array substrate; and
a second via electrically connecting the plurality of second electrodes and the plurality of fourth electrodes through the array substrate.

4. The LED package array of claim 3, further comprising a plurality of first conductive layers disposed to be in contact with a lower portion of the plurality of LEDs and electrically connected to the first via.

5. The LED package array of claim 3, further comprising:
a plurality of heat dissipation vias in contact with a lower portion of the plurality of first conductive layers; and
a plurality of second conductive layers disposed to be in contact with a lower portion of the plurality of heat dissipation vias and electrically connected to the first via.

6. The LED package array of claim 5, further comprising a plurality of heat sinks disposed to oppose the plurality of wavelength conversion units and externally releasing heat generated from the plurality of LEDs.

7. The LED package array of claim 2, further comprising a plurality of wires electrically connecting the plurality of LEDs and the plurality of second electrodes.

8. The LED package array of claim 1, wherein the array substrate is a ceramic substrate.

9. The LED package array of claim 1, wherein the wavelength conversion units is formed by dispersing a wavelength conversion material in a resin.

10. The LED package array of claim 1, wherein the plurality of first inspection terminals and the plurality of second inspection terminals are formed on the edges of the array substrate.

11. The LED package array of claim 10, wherein two first inspection terminals, among the plurality of first inspection terminals, are formed per one row.

12. The LED package array of claim 10, wherein two second inspection terminals, among the plurality of second inspection terminals, are formed per one column.

13. A method for fabricating a light emitting diode (LED) package, the method comprising:
preparing an array substrate and mounting a plurality of LEDs thereon, such that the LEDs are arranged in rows and columns;
forming a plurality of wavelength conversion units in the light path of light emitted from each of the plurality of LEDs to convert the wavelength thereof;
forming a plurality of first inspection terminals on the array substrate and electrically connected to LEDs in the same rows, among the plurality of LEDs;
forming a plurality of second inspection terminals on the array substrate and electrically connected to LEDs in the same columns, among the plurality of LEDs; and
applying an electrical signal to the first and second inspection terminals to inspect light emission of the plurality of LEDs.

14. The method of claim 13, further comprising: supplementarily applying the wavelength conversion material to an LED whose wavelength conversion material is determined to be insufficient according to the results of an inspection of the light emission of the plurality of LEDs.

15. The method of claim 13, further comprising molding a transparent resin on the wavelength conversion unit.

16. The method of claim 13, further comprising dicing the array substrate into LED units.

17. The method of claim 13, wherein the array substrate is a ceramic substrate.

18. The method of claim 13, wherein the wavelength conversion units are formed by dispersing a wavelength conversion material in a resin.

19. The method of claim 18, wherein two first inspection terminals, among the plurality of first inspection terminals, are formed per one row.

20. The method of claim 13, wherein the plurality of first inspection terminals and the plurality of second inspection terminals are formed on the edges of the array substrate.

21. The method of claim 13, wherein two second inspection terminals, among the plurality of second inspection terminals, are formed per one column.

* * * * *